US010923898B2

(12) United States Patent
Frosterød et al.

(10) Patent No.: US 10,923,898 B2
(45) Date of Patent: Feb. 16, 2021

(54) OVERVOLTAGE PROTECTION CIRCUIT INCORPORATING A RESET CIRCUIT FOR A POWER CONVERTER

(71) Applicant: Comrod AS, Tau (NO)

(72) Inventors: Jarle Frosterød, Røyken (NO); Tor Vang Pedersen, Drammen (NO)

(73) Assignee: Comrod AS, Tau (NO)

( * ) Notice: Subject to any disclaimer, the term of this patent is extended or adjusted under 35 U.S.C. 154(b) by 276 days.

(21) Appl. No.: 15/771,492

(22) PCT Filed: Nov. 10, 2016

(86) PCT No.: PCT/NO2016/050226
§ 371 (c)(1),
(2) Date: Apr. 27, 2018

(87) PCT Pub. No.: WO2017/082740
PCT Pub. Date: May 18, 2017

(65) Prior Publication Data
US 2018/0351343 A1    Dec. 6, 2018

(30) Foreign Application Priority Data
Nov. 12, 2015  (NO) .................................. 20151549

(51) Int. Cl.
*H02H 3/02*  (2006.01)
*H02M 1/32*  (2007.01)
(Continued)

(52) U.S. Cl.
CPC ............ *H02H 3/02* (2013.01); *H02H 1/0007* (2013.01); *H02H 3/20* (2013.01); *H02H 7/1252* (2013.01);
(Continued)

(58) Field of Classification Search
None
See application file for complete search history.

(56) References Cited

U.S. PATENT DOCUMENTS

| 5,856,917 A | 1/1999 | Aonuma et al. |
| 5,864,227 A * | 1/1999 | Borden .................. G05F 1/618 |
| | | 323/280 |

(Continued)

FOREIGN PATENT DOCUMENTS

EP    2 194 637    6/2010

OTHER PUBLICATIONS

Norwegian Search Report, Norwegian Patent Application No. 20151549, dated Jun. 2, 2016.
(Continued)

*Primary Examiner* — Jeffrey A Gblende
(74) *Attorney, Agent, or Firm* — Andrus Intellectual Property Law, LLP

(57) ABSTRACT

An overvoltage protection circuit is for a power supply including a power converter, the overvoltage protection circuit having a comparator. The overvoltage protection circuit uses the comparator for comparing the power supply voltage with the reference voltage, and for producing a power supply shutdown signal on the shutdown output terminal when the power supply voltage exceeds the maximal power supply voltage, and for latching said power supply shutdown signal on the shutdown output terminal even if the power supply voltage subsequently drops to a level below the maximal power supply voltage. The overvoltage protection circuit has a reset circuit coupled to the first input of the comparator. The reset circuit is configured for pulling the signal level on the first input below said reference value such that the power supply shutdown signal is reset when a reset signal is given to the reset circuit.

10 Claims, 2 Drawing Sheets

(51) Int. Cl.
  *H02M 1/36* (2007.01)
  *H02H 7/125* (2006.01)
  *H02H 1/00* (2006.01)
  *H02H 3/20* (2006.01)
  *H03K 5/24* (2006.01)

(52) U.S. Cl.
  CPC ............... *H02M 1/32* (2013.01); *H02M 1/36* (2013.01); *H03K 5/24* (2013.01)

(56) References Cited

U.S. PATENT DOCUMENTS

| | | | |
|---|---|---|---|
| 5,986,902 A | 11/1999 | Brkovic et al. | |
| 6,278,597 B1* | 8/2001 | Covi | H02M 3/3376 323/271 |
| 6,600,668 B1 | 7/2003 | Patel et al. | |
| 7,088,078 B2 | 8/2006 | Liu | |
| 7,633,776 B2 | 12/2009 | Usui | |
| 2002/0130645 A1* | 9/2002 | Tsai | G05F 1/24 323/274 |
| 2006/0152951 A1* | 7/2006 | Fagnani | H02M 1/36 363/49 |
| 2007/0165429 A1 | 7/2007 | Selvaraju et al. | |
| 2009/0174978 A1* | 7/2009 | Nakamura | H02H 7/1213 361/90 |
| 2009/0279214 A1 | 11/2009 | Lin et al. | |
| 2012/0187934 A1* | 7/2012 | Suzuki | H02M 3/156 323/311 |
| 2014/0265859 A1* | 9/2014 | Lewis | H05B 45/395 315/121 |

OTHER PUBLICATIONS

International Search Report, PCT/NO2016/050226, dated Jan. 5, 2017.

Written Opinion, PCT/NO2016/050226, dated Jan. 5, 2017.

* cited by examiner

PRIOR ART

OVERVOLTAGE PROTECTION CIRCUIT INCORPORATING A RESET CIRCUIT FOR A POWER CONVERTER

CROSS-REFERENCE TO RELATED APPLICATIONS

This application is the U.S. national stage application of International Application PCT/NO2016/050226, filed Nov. 10, 2016, which international application was published on May 18, 2017, as International Publication WO 2017/082740 in the English language. The International Application claims priority of Norwegian Patent Application No. 20151549, filed Nov. 12, 2015. The international application and Norwegian application are both incorporated herein by reference, in entirety.

FIELD

The invention relates to an overvoltage protection circuit for a power supply comprising a power converter. The invention also relates to a power supply comprising such overvoltage protection circuit.

BACKGROUND

It is known from the prior art that power supplies using (AC-DC) power converters are provided with an overvoltage protection circuit in order to prevent overvoltage to occur on the output of the power supply. Various ways have been reported to implement such functionality, such as: crowbar circuits, clamp circuits (using diodes such as Zener diodes, transient-voltage-suppression diode, variable resistors, and the like), and overvoltage detectors that send a shutdown signal to the power converter. In some applications the overvoltage detector is required to latch in the error state when the overvoltage occurs, which means that even if the power supply voltage subsequently reduces to a level below the predefined maximal level, the shutdown signal must be maintained.

Several circuits providing this functionality have been reported. One of such circuits will be discussed in more detail in the detailed description of FIGS. 1 and 2. At this stage it is only mentioned that this circuit makes uses of a comparator having a feedback path comprising a rectifying element. Such circuits are very difficult to design, that is to say that it is quite difficult to design this circuit such that latching does not occur at start-up of the circuit. The respective components of this circuit have to be dimensioned in accordance with very critical narrow specifications.

SUMMARY

The invention has for its object to remedy or to reduce at least one of the drawbacks of the prior art, or at least provide a useful alternative to prior art.

The object is achieved through features, which are specified in the description below and in the claims that follow.

The invention is defined by the independent patent claims. The dependent claims define advantageous embodiments of the invention.

In a first aspect the invention relates to an overvoltage protection circuit for a power supply comprising a power converter. The overvoltage protection circuit comprises a comparator having a first input for connection to an output of the power converter for receiving the power supply voltage. The comparator further comprises a second input for connection to a reference voltage in operational use, wherein the reference voltage determines a maximal power supply voltage for the power converter. The comparator further comprises a shutdown output terminal. The overvoltage protection circuit is configured for using the comparator for comparing the power supply voltage with the maximal power supply voltage, and for producing a power supply shutdown signal on the shutdown output terminal when the power supply voltage exceeds the maximal power supply voltage. The overvoltage protection circuit is further configured for latching said power supply shutdown signal on the shutdown output terminal even if said power supply voltage subsequently drops to a level below the maximal power supply voltage. Such latching functionality may be implemented by using a rectifier element in the feedback loop of the comparator. The overvoltage protection circuit further comprises a reset circuit coupled to the first input of the comparator. The reset circuit is configured for pulling the signal level on the first input below said reference value such that the power supply shutdown signal is reset when a reset signal is given to the reset circuit.

The effects of the overvoltage protection circuit in accordance with the invention are as follows. When the power supply voltage is below the determined maximal voltage, the comparator will produce an output value on its output indicating that the determined maximal power supply voltage is higher than the power supply voltage. Conventionally, but not necessarily, this output level is a low voltage level. When the overvoltage protection circuit subsequently detects an overvoltage, i.e. the power supply voltage exceeds the determined maximal power supply voltage, the comparator will produce an opposite value on its output, i.e. a high voltage level on its output. The overvoltage protection circuit is further configured to latch this output value, such that the voltage level is maintained even if the power supply voltage subsequently reduces to a voltage level below the determined maximal power supply voltage. Whereas in the prior art solution the circuit has been designed such that it does not latch at start-up, the invention conveniently provides for a reset circuit, which is configured for pulling the signal level on the comparator down such that the output voltage of the comparator flips back to its standard value complying with a power supply voltage being below the determined maximal power supply voltage. The reset may be simply done by giving a reset signal to the input of the reset circuit. The implications of this added circuit are quite large, because it is now no longer relevant if the overvoltage protection circuit latches at start-up. In other words, the design of the circuit has become much less critical and thereby less difficult. All, what needs to be done is to give a reset signal in case latching occurs.

An embodiment of the overvoltage protection circuit in accordance with the invention further comprises a control circuit for generating the reset signal, wherein the control circuit has a reset output coupled to a reset input of the reset circuit for supplying the reset signal to the reset circuit. The control circuit in this embodiment conveniently provides for the "intelligence" when to reset the overvoltage protection circuit, for instance when the overvoltage protection circuit is in the error latching state, while the power supply has to be started up again.

In an embodiment of the overvoltage protection circuit in accordance with the invention the control circuit has a start-up detection input for being coupled to the power converter for detecting start-up of the power converter, wherein the control circuit is configured for generating the reset signal after detection of said start-up. This embodiment solves the issue of latching at starting up very conveniently by sending out a reset signal by default when the power converter is started up. Whether or not the overvoltage protection circuit starts in latching mode or not, is no longer relevant, because the reset signal will set it into the right mode.

In an embodiment of the overvoltage protection circuit in accordance with the invention the control circuit comprises a microprocessor. A microprocessor is a very convenient circuit, which can be used to implement the reset functionality as well as the start-up detection.

In an embodiment of the overvoltage protection circuit in accordance with the invention the reset circuit is configured to be edge triggered, and wherein the control circuit is configured for generating a reset signal in the form of an edge. When the reset circuit is value triggered, i.e. the reset is carried out when the reset input is set at a certain value, it might happen that an unintended reset is carried out. Unintended reset may be caused by the control circuit (microcontroller) having a fault (hardware or software), which causes the reset signal to assume a certain level (for instance high level) continuously. In other words, making the reset circuit edge triggered renders the circuit much more robust.

In an embodiment of the overvoltage protection circuit in accordance with the invention the reset circuit is configured to be positive-edge triggered, and wherein the control circuit is configured for generating a reset signal in the form of a positive-edge. A positive-edge triggered reset circuit conveniently fits the situation when the reset circuit has to pull a node down for resetting using a MOSFET connected between ground the respective node and ground.

In an embodiment of the overvoltage protection circuit in accordance with the invention the reset circuit comprises a high-pass filter coupled to an input of a switching element. When a high-pass filter is provided at the input of the switching element the reset circuit is automatically turned into an edge-triggered circuit. The conductivity type of the switching element determines if the reset circuit is positive-edge triggered (NMOST) or negative edge triggered (PMOST).

In a second aspect the invention relates to a power supply comprising the overvoltage protection circuit in accordance with the invention. The power supply further comprises:
- an AC input for receiving an AC input voltage;
- a power converter coupled to the AC input, wherein the power converter is configured for converting the AC input voltage into a DC output voltage, wherein the power converter comprises a shutdown input coupled to the shutdown overvoltage protection circuit for receiving the shutdown signal, and wherein the power converter is configured for shutting down when the shutdown signal is received, and
- a DC output receiving the DC output voltage from the power converter and supplying it as the power supply voltage for external circuits.

This embodiment describes a possible application of the overvoltage protection circuit of the invention. Yet the invention is not limited to such application per se.

BRIEF DESCRIPTION OF THE DRAWINGS

In the following is described an example of a preferred embodiment illustrated in the accompanying drawings, wherein.

DETAILED DESCRIPTION OF THE DRAWINGS

Before discussing an embodiment of the invention in more detail, a power supply as known from the prior art will be discussed.

Figure 1:
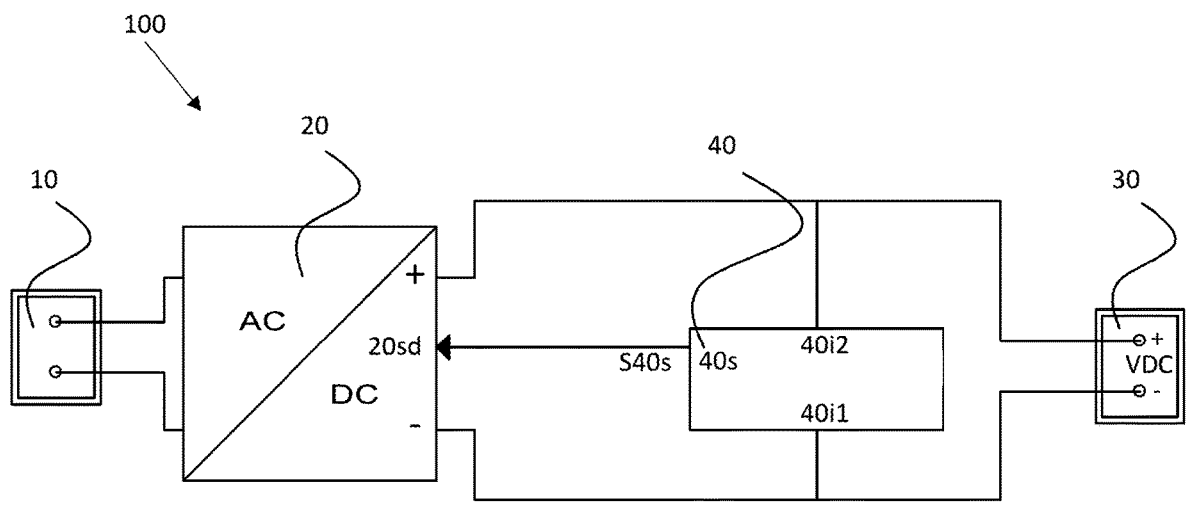
FIG. 1 discloses a power supply in accordance with the prior art comprising a known overvoltage protection circuit.

FIG. 1 discloses a power supply 100 in accordance with the prior art comprising a known overvoltage protection circuit 40. The power supply 100 comprises an AC-input 10 for receiving an AC input voltage. The AC-input is coupled to a power converter 20, which converts the AC input voltage into a DC output voltage VDC on its outputs +,−. The outputs +,− are coupled to a DC-output 30. In many applications it is important that the DC output voltage VDC does not exceed a certain predefined maximal power supply voltage. In order to ensure this an overvoltage protection circuit 40 is provided and coupled to the output as shown. The DC output voltage VDC is fed into the overvoltage protection circuit 40 via input terminals 40i1, 40i2. The overvoltage protection circuit 40 further has an output terminal 40s for supplying a power supply shutdown signal S40s to the power converter 20. The power converter 20 has been provided with a shutdown input 20sd for receiving the power supply shutdown signal S40s from the overvoltage protection circuit 40.

The power supply 100 of FIG. 1 operates as follows. When an AC input voltage is provided on the input 10, a DC output voltage VDC will be generated on the output 30. If, for some reason, the output voltage VDC exceeds a certain predefined maximal power supply voltage, the overvoltage protection circuit 40 (overvoltage detector) will generate and send a power supply shutdown signal S40s to the power converter 20, and the power converter will subsequently shutdown, such that the DC output voltage VDC becomes zero.

Figure 2:
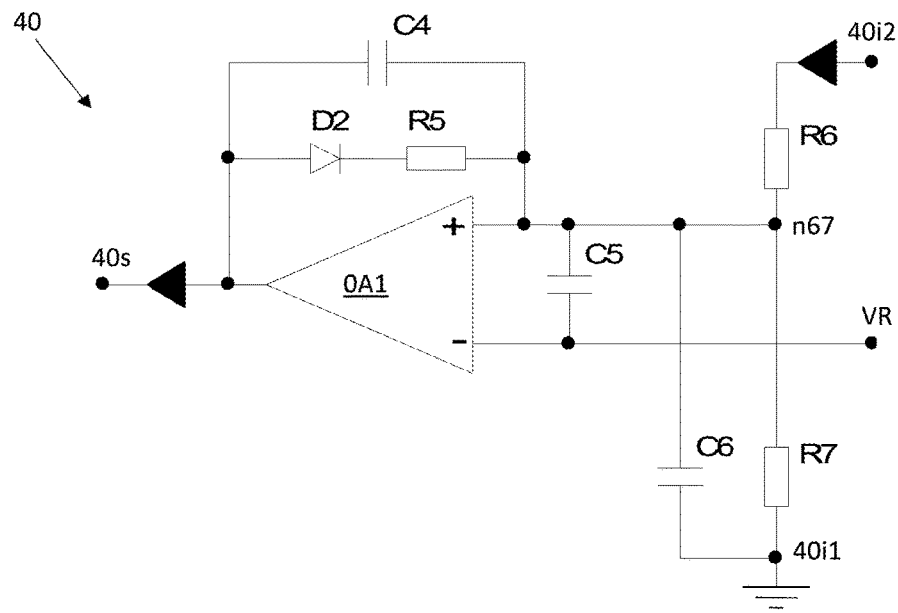
FIG. 2 discloses the overvoltage protection circuit of FIG. 1 in more detail.

FIG. 2 discloses the overvoltage protection circuit 40 of FIG. 1 in more detail. The heart of the circuit is a comparator OA1, also being referred to as a comparator. The DC output voltage VDC is applied to the circuit 40 via said terminals 40i2, 40i1 between which a voltage divider circuit is provided built up out of two resistors R6, R7. It is this voltage divider circuit, which determines the ratio between a reference voltage VR (applied to the negative input of the comparator OA1) and the maximal power supply voltage. Expressed differently, the comparator OA1 will flip its output value at a value of the power supply voltage VDC where the potential at node n67 in between R6, R7 is equal to the reference voltage VR. The circuit 40 further comprises a feedback path from the output of the comparator OA1 to the positive input of the comparator OA1. The feedback path comprises a series connection of a diode D2 and a resistor as shown in FIG. 2. The diode D2 ensures that the comparator OA1 latches its output value when its output voltage goes high. This latching is achieved by the fact that the diode gets forward biased in that scenario, establishing a current path between the output terminal 40s and ground via diode D2, resistor R5, and resistor R7. The output further comprises a series of capacitors C4, C5, C6, which must be carefully dimensioned in order to ensure that the circuit will not enter the latched state when powering up.

Figure 3:
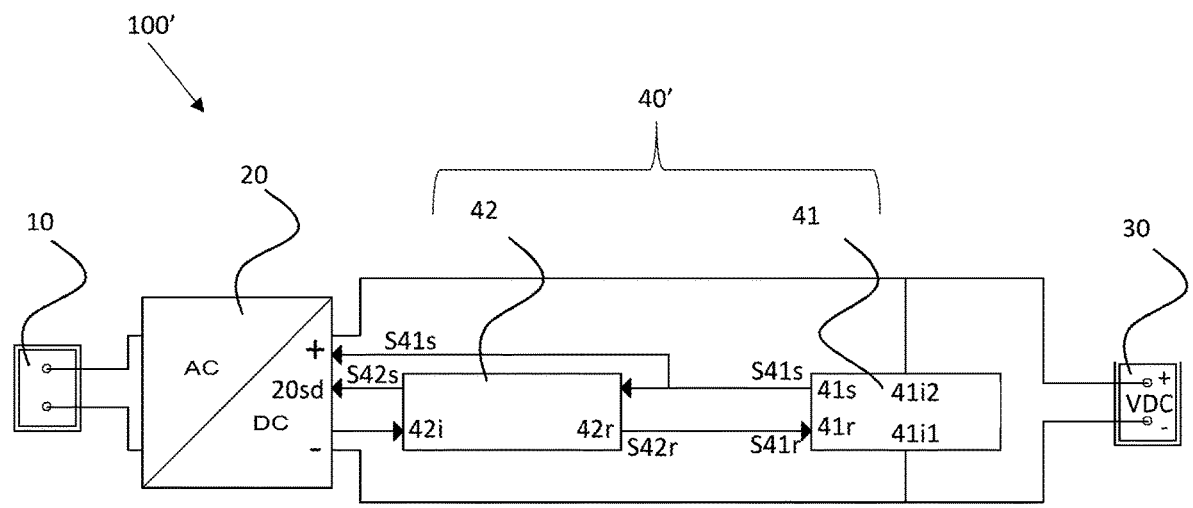
FIG. 3 discloses a power supply in accordance with an embodiment of the invention, and FIG. 4 discloses part of the overvoltage detector circuit of FIG. 3 in more detail.

FIG. 3 discloses a power supply 100' in accordance with an embodiment of the invention. This embodiment will be discussed in as far as it differs from the known power supply 100 of FIG. 1. The overvoltage protection circuit 40' has been modified. In this embodiment the circuit 40' comprises of two parts, namely an overvoltage detector 41 as well as a control circuit 42. The DC output voltage VDC is fed into the overvoltage detector 41 via input terminals 41i1, 41i2 similar to FIG. 1. In addition, the overvoltage detector 41 comprises an output terminal 41s for supplying the power supply shutdown signal S41s to the power converter 20 similar to FIG. 1. What is clearly new with respect to FIG. 1 is that the overvoltage detector 41 comprises a reset input terminal 41r for receiving a reset signal S41r. In this embodiment the reset signal S41r is generated by the control circuit 42 having a reset output terminal 42r supplying the reset signal S42r to the reset input 41r of the overvoltage detector 41. The control circuit 42 comprises a start-up detection input 42i which is connected to the power converter 20 for receiving a start-up detection signal therefrom. In this way, the control circuit 42 can detect start-up of the power converter 20. Alternatively, the output of the power converter 20 might be fed into the control circuit 42 such that it can detect start-up of the power converter 20. When it comes down to the power supply shutdown signal 41s, this signal is both into the control circuit 42 as well as directly to the power converter 20. The reason for this is that the control circuit 42 may also provide a power supply shutdown signal S42s without the overvoltage detector 41 detecting an overvoltage. In an embodiment of the invention the control circuit 42 may be microprocessor.

Figure 4:
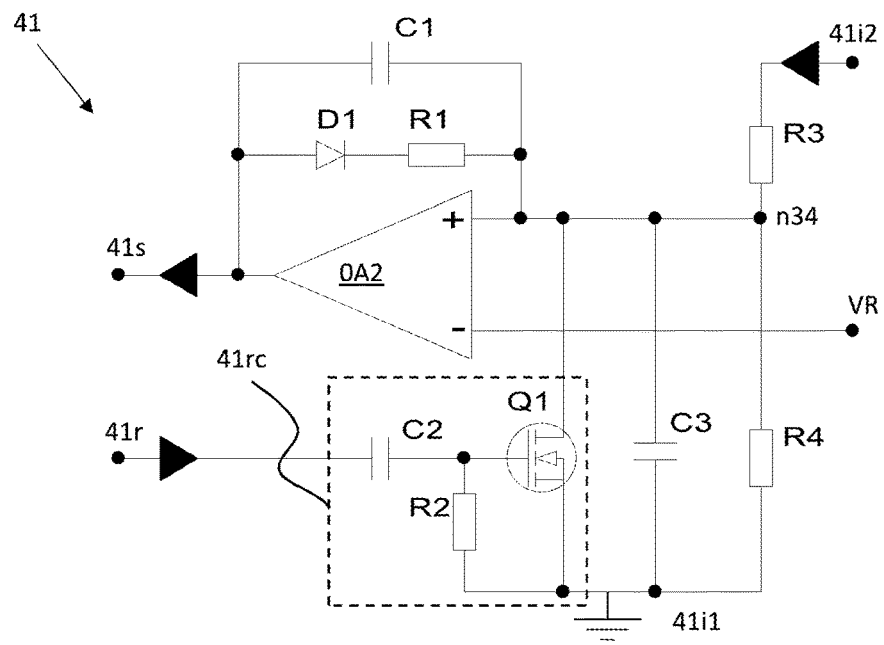

FIG. 4 discloses part of the overvoltage detector circuit 41 of FIG. 3 in more detail. The figure will be mainly discussed in as far as it differs from FIG. 2. The heart of the circuit 41 is again a comparator OA2. The voltage divider network at the positive input is similarly build up out of two resistors R3, R4 connected in series via a respective node n34 (coupled to the positive input of the comparator OA2) in order to determine the maximal power supply voltage in dependence of the reference voltage VR. The feedback circuit similar comprises a series connection of a diode D1 and a resistor R1. A main difference between the embodiment of FIG. 4 and the known circuit of FIG. 2 is the presence of a reset circuit 41rc which is coupled to the positive input of the comparator OA2 and to ground. The reset circuit 41rc comprises a reset transistor Q1 (a MOSFET) coupled with its drain to the positive input of the comparator OA2 and with its source to the ground node (connected to the first input terminal 41i1). The gate of the reset transistor Q1 is connected to a high-pass filter built up out of a capacitor C2 and a resister R2 as shown. The high-pass filter in combination with the transistor being an NMOST ensures that the reset circuit 41rc is positive-edge triggered. The positive edge signal on the gate will result in a short time that the transistor Q1 is conducting such that the voltage on the positive input of the comparator OA2 is quickly pulled to a level below the reference voltage VR such that the output of the comparator OA2 flips to a low value.

An advantageous effect of the reset circuit 41rc is that it no longer needs to be avoided that the circuit starts in latch mode. A simple reset, for instance, right after starting will ensure that the circuit is in the right mode. In FIG. 4 there is shown only two capacitors C1, C3 instead of three as in FIG. 2. Moreover, in fact the capacitor C3 that is connected parallel to resistor R4 is optional. Moreover, the dimensioning of the capacitor(s) C1, C3 is no longer critical and design of the circuit has become much easier.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage. In the device claim enumerating several means, several of these means may be embodied by one and the same item of hardware.

The invention claimed is:

1. Overvoltage protection circuit for a power supply comprising a power converter, the overvoltage protection circuit comprising:
    a comparator having a first input for connection to an output of the power converter for receiving a power supply voltage, and a second input for connection to a reference voltage in operational use, wherein the reference voltage determines a maximal power supply voltage for the power converter, the comparator further comprising a shutdown output terminal, wherein the overvoltage protection circuit is configured for using the comparator for comparing the power supply voltage with the maximal power supply voltage, and for producing a power supply shutdown signal on the shutdown output terminal when the power supply voltage exceeds the maximal power supply voltage, and for latching said power supply shutdown signal on the shutdown output terminal even if said power supply voltage subsequently drops to a level below the maximal power supply voltage;
    a reset circuit coupled to the first input of the comparator, the reset circuit being configured for pulling the signal level on the first input below said reference voltage such that the power supply shutdown signal is reset when a reset signal is given to the reset circuit;
    a control circuit for generating the reset signal, the control circuit having a reset output coupled to a reset input of the reset circuit for supplying the reset signal to the reset circuit; and
    a start-up detection input for being coupled to the power converter for detecting start-up of the power converter, wherein the control circuit is configured for generating the reset signal after detection of said start-up.

2. The overvoltage protection circuit according to claim 1, wherein the control circuit comprises a microprocessor.

3. The overvoltage protection circuit according to claim 1, wherein the reset circuit is configured to be edge triggered, and wherein the control circuit is configured for generating a reset signal in the form of an edge.

4. The overvoltage protection circuit according to claim 3, wherein the reset circuit is configured to be positive-edge triggered, and wherein the control circuit is configured for generating a reset signal in the form of a positive-edge.

5. The overvoltage protection circuit according to claim 3, wherein the reset circuit comprises a high-pass filter coupled to an input of a switching element.

6. Overvoltage protection circuit for a power supply comprising a power converter, the overvoltage protection circuit comprising:

a comparator having a first input for connection to an output of the power converter for receiving a power supply voltage, and a second input for connection to a reference voltage in operational use, wherein the reference voltage determines a maximal power supply voltage for the power converter, the comparator further comprising a shutdown output terminal, wherein the overvoltage protection circuit is configured for using the comparator for comparing the power supply voltage with the maximal power supply voltage, and for producing a power supply shutdown signal on the shutdown output terminal when the power supply voltage exceeds the maximal power supply voltage, and for latching said power supply shutdown signal on the shutdown output terminal even if said power supply voltage subsequently drops to a level below the maximal power supply voltage;

a reset circuit having a reset input terminal and an output, the output of the reset circuit being coupled to the first input of the comparator other than the reset input terminal, and the reset circuit being configured for pulling via the output the signal level on the first input below said reference value such that the power supply shutdown signal is reset when a reset signal is received at the reset input terminal of the reset circuit;

a control circuit for generating the reset signal, the control circuit having a reset output coupled to the reset input terminal of the reset circuit for supplying the reset signal to the reset circuit; and a start-up detection input for being coupled to the power converter for detecting start-up of the power converter, wherein the control circuit is configured for generating the reset signal after detection of said start-up.

7. The overvoltage protection circuit according to claim 6, wherein the control circuit comprises a microprocessor.

8. The overvoltage protection circuit according to claim 6, wherein the reset circuit is configured to be edge triggered, and wherein the control circuit is configured for generating a reset signal in the form of an edge.

9. The overvoltage protection circuit according to claim 8, wherein the reset circuit is configured to be positive-edge triggered, and wherein the control circuit is configured for generating a reset signal in the form of a positive-edge.

10. The overvoltage protection circuit according to claim 8, wherein the reset circuit comprises a high-pass filter coupled to an input of a switching element.

* * * * *